(12) United States Patent
Nakamura et al.

(10) Patent No.: US 8,395,717 B2
(45) Date of Patent: Mar. 12, 2013

(54) LIQUID CRYSTAL DISPLAY APPARATUS

(75) Inventors: Yayoi Nakamura, Hino (JP); Shinichi Shimomaki, Akishima (JP)

(73) Assignee: Casio Computer Co., Ltd., Tokyo (JP)

( * ) Notice: Subject to any disclaimer, the term of this patent is extended or adjusted under 35 U.S.C. 154(b) by 91 days.

(21) Appl. No.: 13/159,669

(22) Filed: Jun. 14, 2011

(65) Prior Publication Data

US 2011/0310340 A1    Dec. 22, 2011

(30) Foreign Application Priority Data

Jun. 21, 2010   (JP) ................. 2010-140079

(51) Int. Cl.
  *G02F 1/136*   (2006.01)
(52) U.S. Cl. .......................... 349/48; 349/43
(58) Field of Classification Search ............ 349/38, 349/43
  See application file for complete search history.

(56) References Cited

FOREIGN PATENT DOCUMENTS

| JP | 10-070277 A | 3/1998 |
|---|---|---|
| JP | 2000-122574 A | 4/2000 |
| JP | 2003-107490 A | 4/2003 |
| JP | 2004-341185 A | 12/2004 |
| JP | 2009-198853 A | 9/2009 |

*Primary Examiner* — Phu Vu

(74) *Attorney, Agent, or Firm* — Holtz, Holtz, Goodman & Chick, PC

(57) ABSTRACT

A liquid crystal display element includes a thin-film transistor in which one of source and drain electrodes is connected to a pixel electrode, and an auxiliary capacitance electrode that forms an auxiliary capacitance together with the pixel electrode and at least partially overlaps with the thin-film transistor. The thin-film transistor includes a semiconductor layer, an anti-etching layer that is arranged in contact with the semiconductor layer and made of an insulative material, and a gate electrode that is arranged to interpose the semiconductor layer between the gate electrode itself and the anti-etching layer. A region in the auxiliary capacitance electrode that overlaps with the gate electrode has a length in a direction parallel to a channel length direction of the thin-film transistor that is shorter than a length of the gate electrode in this direction and longer than a length of the anti-etching layer in this direction.

20 Claims, 15 Drawing Sheets

LIQUID CRYSTAL DISPLAY APPARATUS

CROSS-REFERENCE TO RELATED APPLICATIONS

This application is based upon and claims the benefit of priority from prior Japanese Patent Application No. 2010-140079, filed Jun. 21, 2010, the entire contents of which are incorporated herein by reference.

BACKGROUND OF THE INVENTION

1. Field of the Invention

The present invention relates to a liquid crystal display element in which an auxiliary capacitance electrode is arranged so as to overlap with a thin-film transistor.

2. Description of the Related Art

In recent years, an active matrix crystal display element using a thin-film transistor (TFT) as a switching element has been developed. In the active matrix type liquid crystal display element, an auxiliary capacitance is formed to hold a display signal voltage written in a pixel electrode until the next write timing. This auxiliary capacitance is formed by an auxiliary capacitance electrode arranged to interpose an insulating layer between the auxiliary capacitance electrode itself and a pixel electrode.

Meanwhile, in configurations that an inversely-staggered structure (a bottom gate structure) is adopted for a thin-film transistor, to avoid light leak that occurs due to light entering from a liquid crystal layer side toward the thin-film transistor, a structure that an auxiliary capacitance electrode also functions as a light shielding film for the light has been known (e.g., JP-A 2004-341185 (KOKAI)—FIG. 5). That is, a structure that the auxiliary capacitance electrode made of a metal having light shielding properties such as chrome or molybdenum is formed between a source/drain electrode layer and a pixel electrode layer so as to overlap with a thin-film transistor has been known.

However, since the auxiliary capacitance electrode is formed as a film on a flatly formed insulating layer by, e.g., a sputtering method so that a lower surface of the auxiliary capacitance electrode is in contact with the insulating layer, the lower surface of the auxiliary capacitance electrode is disadvantageously formed as a mirror finished surface.

Therefore, in lights traveling toward the liquid crystal layer from a substrate side having the thin-film transistor formed thereon, light traveling toward the auxiliary capacitance electrode through a position near the thin-film transistor is reflected by the auxiliary capacitance electrode while maintaining a high light quantity, and this reflected light enters a semiconductor layer of the thin-film transistor even in an inversely-staggered configuration, whereby a light leak current is generated between a source electrode and a drain electrode.

BRIEF SUMMARY OF THE INVENTION

An object of the invention is to provide a liquid crystal display element in which a light leak current is suppressed even through it includes an auxiliary capacitance electrode overlapping with the thin-film transistor.

A liquid crystal display element according to an aspect of the invention includes a thin-film transistor in which one of a source electrode and a drain electrode is connected to a pixel electrode, and an auxiliary capacitance electrode which forms an auxiliary capacitance between the auxiliary capacitance electrode itself and the pixel electrode and is arranged to at least partially overlap with the thin-film transistor. The thin-film transistor includes a semiconductor layer, an anti-etching layer which is arranged in contact with the semiconductor layer and made of an insulative material, and a gate electrode which is arranged to interpose the semiconductor layer between the gate electrode itself and the anti-etching layer. A region in the auxiliary capacitance electrode which overlaps with the gate electrode has a length in a direction parallel to a channel length direction of the thin-film transistor which is shorter than a length of the gate electrode in this direction and longer than a length of the anti-etching layer in this direction.

A liquid crystal display element according to another aspect of the invention includes a liquid crystal layer which is arranged between a common electrode and a pixel electrode, a thin-film transistor in which one of a source electrode and a drain electrode is connected to the pixel electrode, and an auxiliary capacitance electrode which is set to a potential equal to the potential of the common electrode and arranged to at least partially overlap with the thin-film transistor. The thin-film transistor includes a semiconductor layer, an anti-etching layer which is arranged in contact with the semiconductor layer and made of an insulative material, and a gate electrode which is arranged to interpose the semiconductor layer between the gate electrode itself and the anti-etching layer. A region in the auxiliary capacitance electrode overlapping the gate electrode has a length in a direction parallel to a channel length direction of the thin-film transistor being shorter than a length of the gate electrode in this direction and longer than a length of the anti-etching layer in this direction.

A liquid crystal display element according to still another aspect of the invention includes a scan line which is arranged to extend in a first direction, a thin-film transistor in which one of a source electrode and a drain electrode is connected to a pixel electrode, and an auxiliary capacitance electrode which forms an auxiliary capacitance between the auxiliary capacitance electrode itself and the pixel electrode and is arranged to at least partially overlap with the thin-film transistor. The thin-film transistor includes a semiconductor layer, an anti-etching layer which is arranged in contact with the semiconductor layer and made of an insulative material, and a gate electrode which is arranged to interpose the semiconductor layer between the gate electrode itself and the anti-etching layer and connected to the scan line. A region in the auxiliary capacitance electrode overlapping the gate electrode has a length in a second direction orthogonal to the first direction being shorter than a length of the gate electrode in the second direction and longer than a length of the anti-etching layer in the second direction.

According to the invention, even through a liquid crystal display element includes an auxiliary capacitance electrode overlapping with the thin-film transistor, a light leak current is suppressed.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A mode for carrying out the present invention will now be described with reference to the drawings.

Figure 1A:
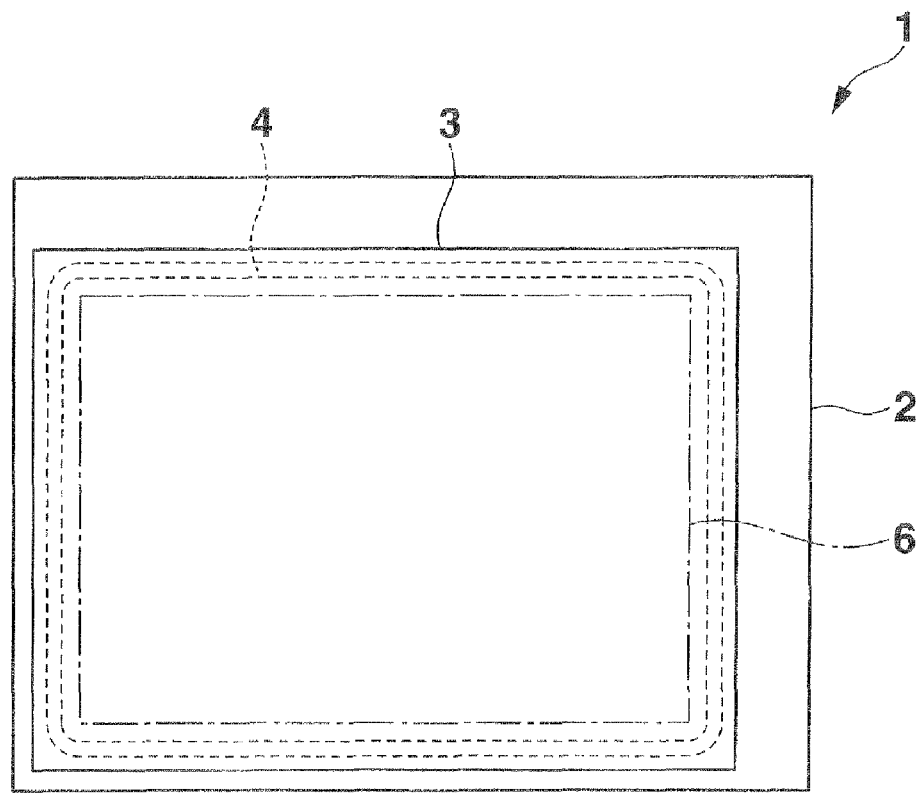
FIG. 1A is a schematic plan view of a liquid crystal display element.
Figure 1B:
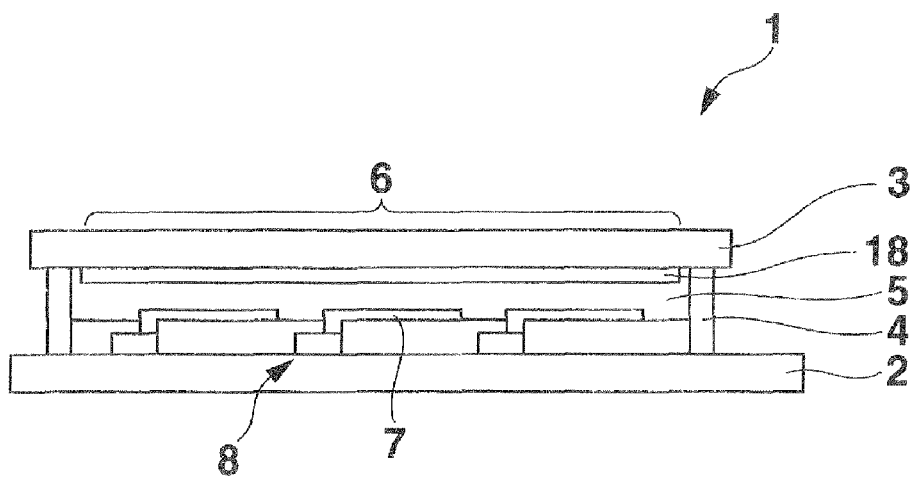
FIG. 1B is a schematic cross-sectional view of the liquid crystal display element.

As shown in FIG. 1A and FIG. 1B, in a liquid crystal display element 1 according to the present invention, a first substrate 2 and a second substrate 3 are arranged to face each other. The first substrate 2 and the second substrate 3 are bonded by a seal material 4 formed into a frame shape. A region surrounded by the seal material 4 between the first substrate 2 and the second substrate 3 is filled with a liquid crystal, thereby forming a liquid crystal layer 5. The liquid crystal display element 1 has display pixels arranged in a matrix form in a display region 6.

Figure 2:
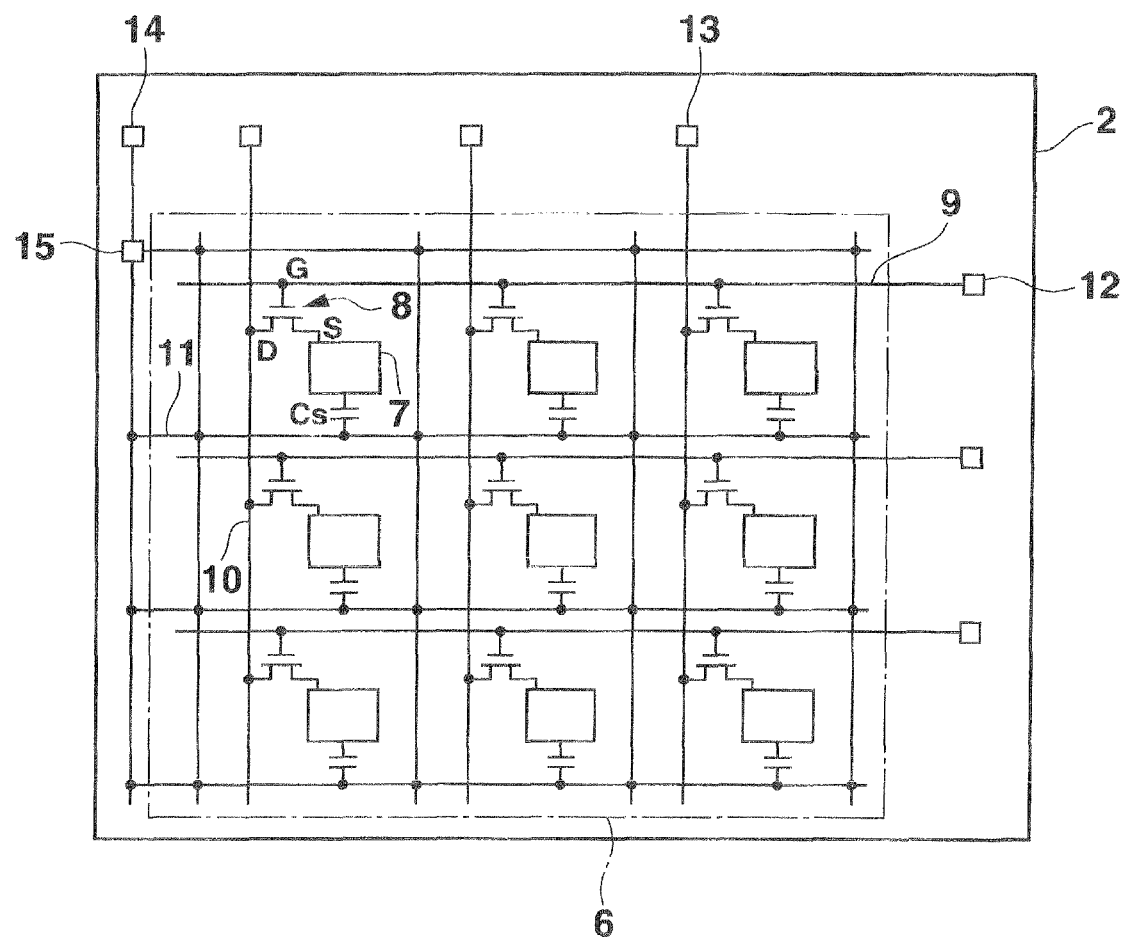
FIG. 2 is an equivalent circuit plan view of a thin-film transistor array.

The liquid crystal display element 1 is an active matrix type liquid crystal display element, and FIG. 2 is an equivalent circuit plan view of a thin-film transistor array formed on the first substrate 2. In the first substrate 2, pixel electrodes 7 are aligned in a matrix form in the display region 6 so that one pixel electrode 7 is associated with one display pixel. Each of the pixel electrodes 7 is connected to one of source/drain electrodes of each corresponding thin-film transistor 8, e.g., a source electrode S. The other of the source/drain electrodes of the thin-film transistor 8, e.g., a drain electrode D, is connected to a signal line 10 extending along a column direction. A gate electrode G of the thin-film transistor 8 is connected to a scan line 9 extending along a row direction. An auxiliary capacitance electrode 11 used for forming an auxiliary capacitance Cs between the auxiliary capacitance electrode itself and the pixel electrode 7 is formed in a lattice shape to overlap with the thin-film transistor 8. The pixel electrode 7 is arranged so that a part of a peripheral edge portion 7a of the pixel electrode 7 overlaps with the auxiliary capacitance electrode 11. The thin-film transistor 8 functions as a switching element and, for example, an nMOS type thin-film transistor can be used. The scan line 9 is to supply a scan signal for ON/OFF control over the thin-film transistor 8 to the gate electrode G of the thin-film transistor 8, and the signal line 10 is to supply a data signal to the pixel electrode 7 through the thin-film transistor 8.

The scan line 9, the signal line 10, and the auxiliary capacitance electrode 11 are extended to a region outside the display region 6. Each scan line 9 is connected to a first external connection terminal 12 provided in the region outside the display region 6, each signal line 10 is connected to a second external connection terminal 13 provided in the region outside the display region 6, and each auxiliary capacitance electrode 11 is connected to a third external connection terminal 14 provided in the region outside the display region 6. The auxiliary capacitance electrodes 11 are electrically connected to each other to provided the same potential in the respective display pixels, and they are electrically connected to a later-described common electrode 18 through a transformer pad 15. That is, each auxiliary capacitance electrode 11 is set to a potential equal to that in the common electrode 18. When each external connection terminal 12, each second external connection terminal 13, and each third external connection terminal 14 are connected to a member such as a flexible wiring board, they are electrically connected to an external circuit through this flexible wiring board.

As shown in FIG. 1B, the common electrode 18 on which the respective display pixels are set to the same potential is formed on the second substrate 3. The region surrounded by the seal material 4 is filled with the liquid crystal so that the liquid crystal layer 5 is formed between the common electrode 18 and the pixel electrodes 7.

Figure 3:
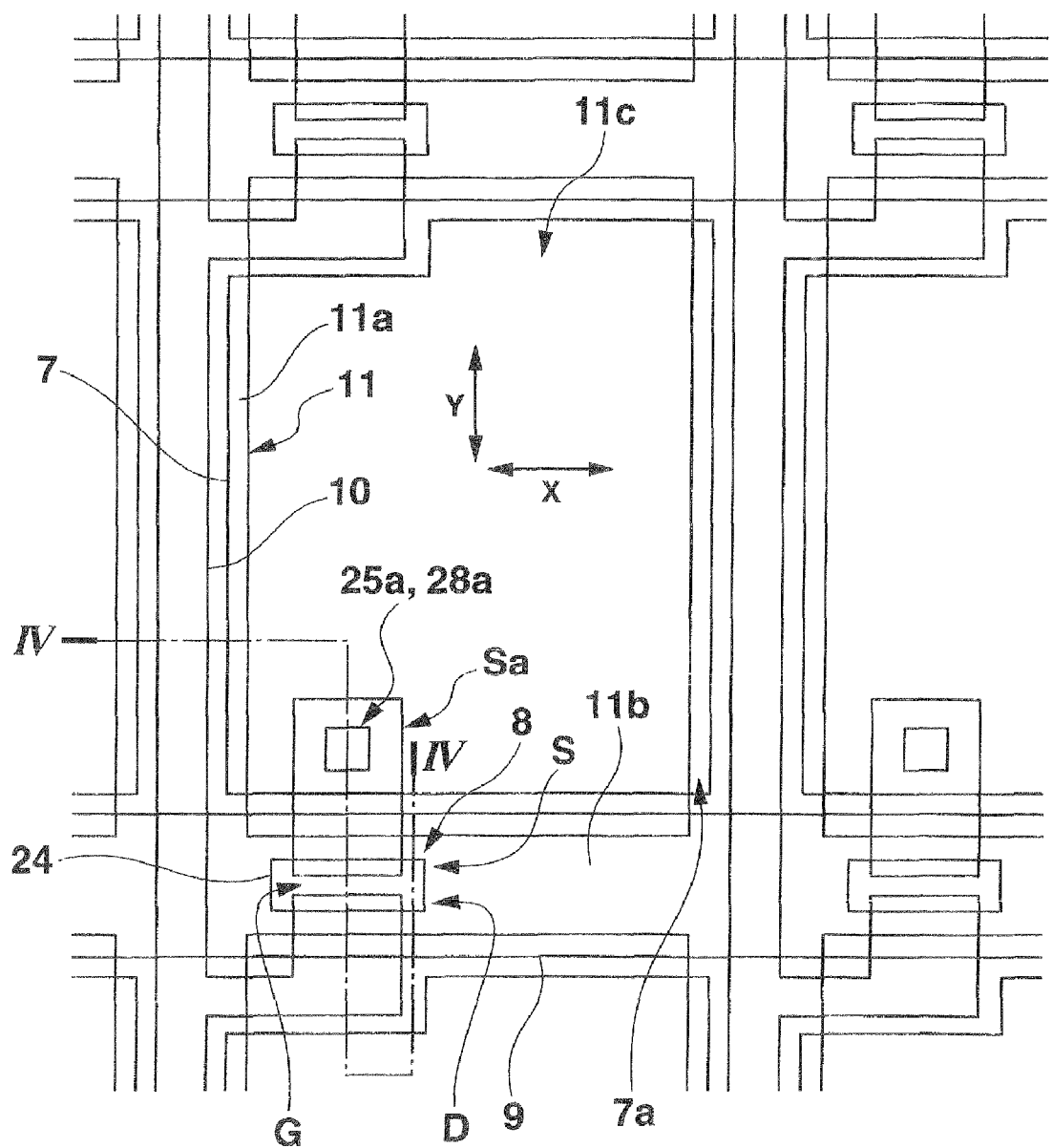
FIG. 3 is a plan view of a multilayer film formed on a first substrate.
Figure 4:
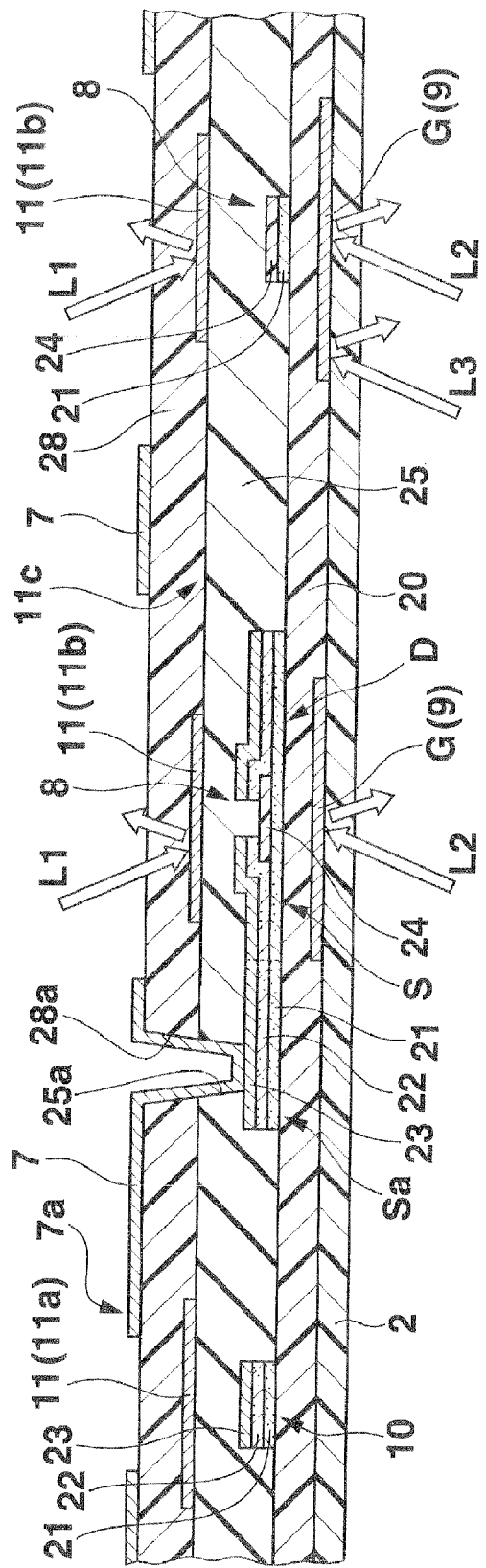
FIG. 4 is a cross-sectional view of a region taken along a line IV-IV in FIG. 3.

A layer configuration of each thin film formed on the first substrate 2 will now be described with reference to FIG. 3 and FIG. 4. A description on the region outside the display region will be omitted. The gate electrode G and the scan line 9 are formed as a first conductive layer on the first substrate 2 made of a transparent member such as glass. The first conductive layer is formed by using a light shielding metal such as chrome, aluminum, molybdenum, or titanium as a material. The first conductive layer is covered with a first insulating layer made of an insulative material. The first insulating layer 20 functions as a gate insulating film, and it is formed of an inorganic material such as a silicon nitride (SiN or $Si_3N_4$) or a silicon oxide ($SiO_2$).

The source electrode S, a connection pad portion Sa extended from the source electrode S, the drain electrode D, and the signal line 10 are formed as a second conductive layer on the first insulating layer 20. The second conductive layer is formed to have a multilayer structure in which a semiconductor layer 21, an ohmic contact layer 22, and a metal layer 23 are sequentially laminated. The semiconductor layer 21 is formed of a semiconductor such as amorphous silicon or polysilicon. The ohmic contact layer 22 is formed of a relatively-low-resistance semiconductor in which amorphous silicon or polysilicon has an impurity doped therein. The metal layer 23 is formed by using a light shielding metal, e.g., chrome, aluminum, molybdenum, or titanium as a material.

The semiconductor layer 21 is formed in a region associated with a channel in the thin-film transistor 8, and an anti-etching layer 24 made of an insulative material is provided as a layer between the semiconductor layer 21 and the ohmic contact layer 22. The anti-etching layer 24 is formed so that its length in a direction (a direction indicated by an arrow head Y in FIG. 3, which will be referred to as a Y direction hereinafter) along a channel length direction is shorter than a length of the gate electrode G in the Y direction. It is assumed that the gate electrode G is integrally formed with the scan line 9 and the length of the gate electrode G in the Y direction is equal to a width of the scan line 9, i.e., a length of the scan line 9 in the Y direction.

The second conductive layer and the thin-film transistor 8 are covered with a second insulating layer 25 made of an insulative material. The second insulating layer 25 also functions as a flattening layer that flattens a step produced by the thin-film transistor 8 or the signal line 10, and it is made of an inorganic material such as a silicon nitride (SiN or $Si_3N_4$) or a silicon oxide ($SiO_2$).

The auxiliary capacitance electrode 11 is formed as a third conductive layer on the second insulating layer 25. The auxiliary capacitance electrode 11 is formed into a lattice shape so as to so as the scan line 9, the signal line 10, and the thin-film transistor 8. The third conductive layer is formed by using a light shielding metal, e.g., chrome, aluminum, molybdenum, or titanium as a material.

The auxiliary capacitance electrode 11 is constituted of a first muntin portion 11a extending in a direction parallel to the signal line 10, i.e., the Y direction and a second muntin portion 11b extending in a direction parallel to the scan line 9, i.e., a direction parallel to a channel width direction (a direction indicated by an arrow X in FIG. 3, which will be referred to as an X direction hereinafter). The second muntin portion 11b is formed so that its length in the Y direction is longer than a length of the anti-etching layer 24 in the Y direction but shorter than a length of the gate electrode G in the Y direction. The gate electrode G, the anti-etching layer 24, and the second muntin portion 11b are arranged so that their center positions in the region associated with the thin-film transistor 8 in the Y direction coincide with each other. That is, the gate electrode G, the anti-etching layer 24, and the second muntin portion 11b are arranged so that their inter-edge distances are symmetrical in the region associated with the thin-film transistor 8 in the Y direction.

The third conductive layer is covered with a third insulating layer 28 made of an insulative material. The third insulating layer 28 also functions as a flattening layer that flattens a step produced by the thin-film transistor 8 or the signal line 10 and a step produced by the auxiliary capacitance electrode 11, and it is formed by using an inorganic material, e.g., a silicon nitride (SiN or $Si_3N_4$) or a silicon oxide ($SiO_2$).

The pixel electrode 7 is formed as a fourth conductive layer on the third insulating layer 28. The fourth conductive layer is formed of a transparent conductive material, e.g., an ITO (Indium Tin Oxide). The pixel electrode 7 is in contact with an upper surface of the metal layer 23 at the connection pad portion Sa in contact holes 25a and 28a continuously provided in the second insulating layer 25 and the third insulating layer 28, so as to be electrically connected to the source electrode S. The pixel electrode 7 is formed so as to overlap with an opening portion 11c of the auxiliary capacitance electrode 11 formed into the lattice shape and so that the peripheral edge portion 7a of the pixel electrode overlaps with the first muntin portion 11a of the auxiliary capacitance electrode 11. The pixel electrodes 7 are arranged so that a gap between a pixel electrode and an adjacent pixel electrode overlaps with the first muntin portion 11e of the auxiliary capacitance electrode 11.

In the liquid crystal display element having the above-described configuration, since light L1 that travels toward the semiconductor layer 21 in thin-film transistor 8 through the second substrate 3 can be reflected by the auxiliary capacitance electrode 11, a light leak current generated between the source electrode S and the drain electrode P based on this light L1 can be effectively suppressed. Since light L2 that directly travels toward the semiconductor layer 21 in the thin-film transistor 8 through the first substrate 2 can be reflected by the gate electrode G, a light leak current generated between the source electrode S and the drain electrode D based on this light L2 can be effectively suppressed. Since light L3 that has passed through the first substrate 2 toward the auxiliary capacitance electrode 11 in the region overlapping the thin-film transistor 8 can be also reflected by the gate electrode G, a light leak current generated between the source electrode S and the drain electrode D based on this light L3 can be likewise effectively suppressed.

Figure 5:
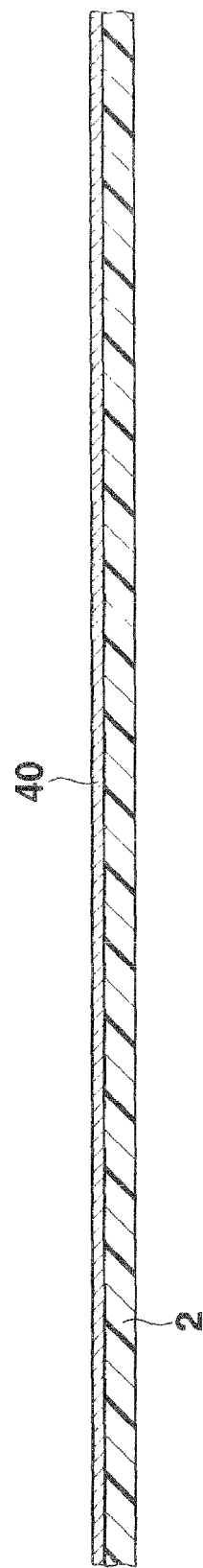
FIG. 5 is an explanatory view of a forming method of the multilayer film formed on the first substrate, showing a state that a first conductive layer is formed as a film on the first substrate.
Figure 6:
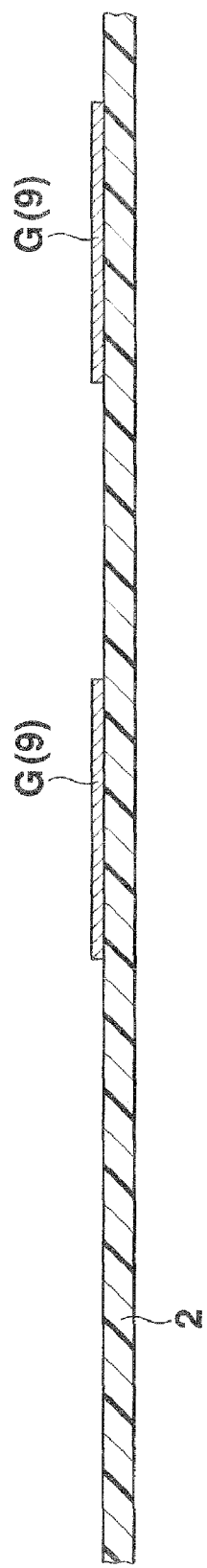
FIG. 6 is an explanatory view of a forming method of the multilayer film formed on the first substrate, showing a state that the first conductive layer is patterned.

A forming method of the multilayer film formed on the first substrate 2 as described above will now be explained based on FIGS. 5 through 15. FIGS. 5 through 15 are cross-sectional views corresponding to a region taken along a line IV-IV in FIG. 3. First, the first substrate 2 formed of a transparent member such as glass is prepared, and a metal having light shielding properties, e.g., chrome, aluminum, molybdenum, or titanium is formed as a first conductive layer 40 on one surface of the first substrate 2 based on a sputtering method or a CVD (Chemical Vapor Deposition) method as shown in FIG. 5. The first conductive layer 40 is formed as a film to have a layer thickness of, e.g. 100 to 500 nm.

Then, a photoresist is applied to an upper side of the first conductive layer 40, and this applied photoresist is patterned based on exposure and development. Subsequently, the patterned photoresist is utilized as a mask to etch the first conductive layer 40 at portions exposed from this photoresist, and then the photoresist is delaminated, whereby each gate electrode G and each scan line 9 are formed as the patterned first conductive layer 40.

Then, an inorganic insulating material, e.g., a silicon nitride (SiN or $Si_3N_4$) or a silicon oxide ($SiO_2$) is formed on the first substrate 2 as the translucent first insulating layer 20 based on a plasma CVD method or the like to cover the patterned first conductive layer 40. For example, when forming the first insulating layer 20 by using a silicon nitride, in regard to a process gas, silane ($SiH_4$) is used as a main raw material gas, ammonia ($NH_3$) is used as a sub-raw material gas, and nitrogen ($N_2$) is used as a diluents gas. The first insulating layer 20 is formed as a film to have a layer thickness of, e.g., 200 to 800 nm. It is preferable to form the first insulating layer 20 as a film to have the layer thickness larger than that of the first conductive layer 40.

Figure 7:
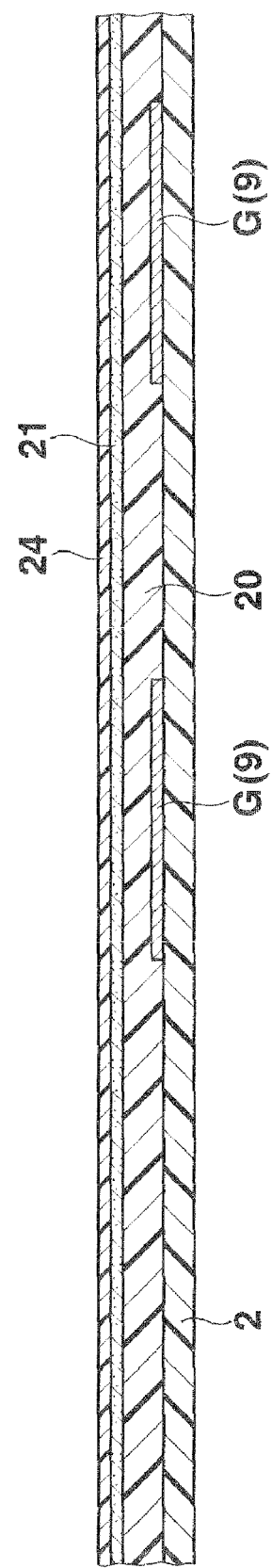
FIG. 7 is an explanatory view of the forming method of the multilayer film formed on the first substrate, showing a state that a first insulating layer, a semiconductor layer, and an anti-etching layer are formed as films.

Then, as shown in FIG. 7, the semiconductor layer 21 is made of amorphous silicon or polysilicon is formed on the first insulating layer 20 by, e.g., the plasma CVD method, and thereafter an inorganic insulating material, e.g., a silicon nitride (SiN or $Si_3N_4$) is formed on the semiconductor layer 21 as a translucent anti-etching layer 24 by, e.g., the plasma CVD method. It is preferable to continuously form the first insulating layer 20, the semiconductor layer 21, and the anti-etching layer 24. The semiconductor layer 21 is formed as a film to have a layer thickness of, e.g., 20 to 60 nm. The anti-etching layer 24 is formed as a film to have a layer thickness of, e.g., 100 to 200 nm.

Figure 8:
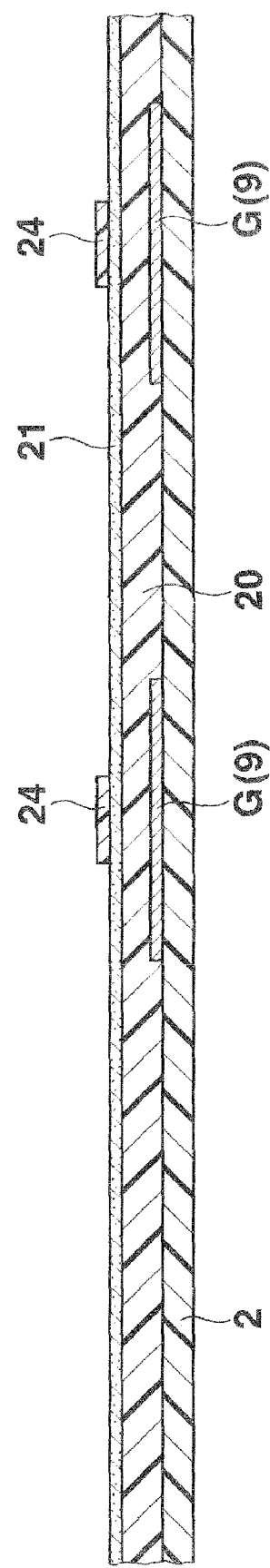
FIG. 8 is an explanatory view of the forming method of the multilayer film formed on the first substrate, showing a state that the anti-etching layer is patterned.

Then, a photoresist is applied to the upper side of the anti-etching layer 24, and this applied photoresist is patterned based on exposure and development. Subsequently, the patterned photoresist is utilized as a mask to etch the anti-etching layer 24 at portions exposed from this photoresist, and thereafter the photoresist is delaminated, thereby forming the anti-etching layer 24 patterned to remain in a region associated with a channel in the thin-film transistor 8 (FIG. 8).

Figure 9:
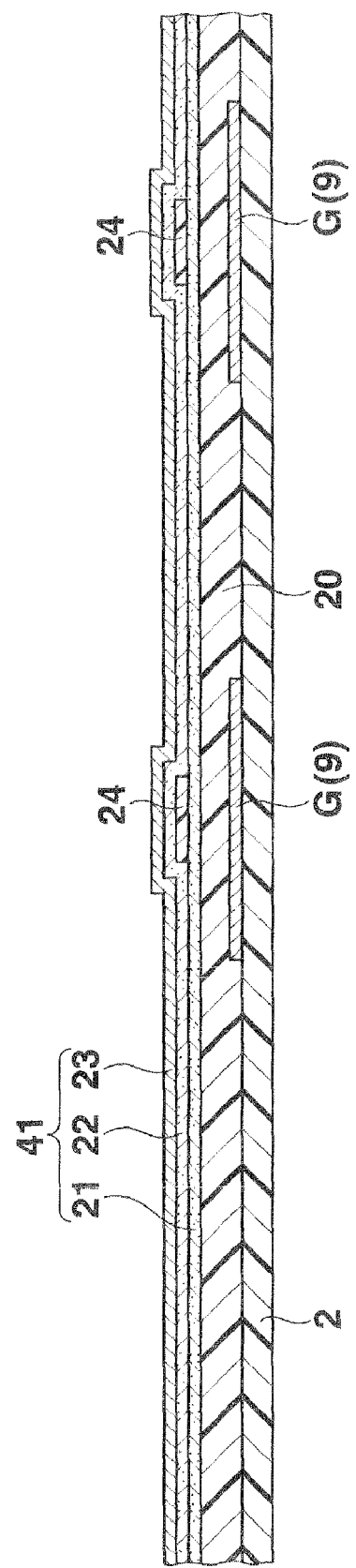
FIG. 9 is an explanatory view of the forming method of the multilayer film formed on the first substrate, showing a state that an ohmic contact layer and a metal layer are formed as films.

Then, a relatively-low-resistance semiconductor having an impurity doped in amorphous silicon or polysilicon is formed as an ohmic contact layer 22 on the first substrate 2, and the metal layer 23 made of a light shielding metal, e.g., chrome, aluminum, molybdenum, or titanium is formed as a film on the ohmic contact layer 22 by the sputtering method or the CVD method (FIG. 9). The metal layer 23 does not have to be necessarily restricted to the light shielding metal, and it may be a transparent conductive material, e.g., an ITO. The ohmic contact layer 22 is formed as a film having a layer thickness of, e.g., 10 to 40 nm. The metal layer 23 is formed as a film having a layer thickness of, e.g., 100 to 500 nm.

When the semiconductor layer 21, the ohmic contact layer 22, and the metal layer 23 are sequentially formed as the films as described above, a second conductive layer 41 as a laminated film including the semiconductor layer 21, the ohmic contact layer 22, and the metal layer 23 is formed.

Figure 10:
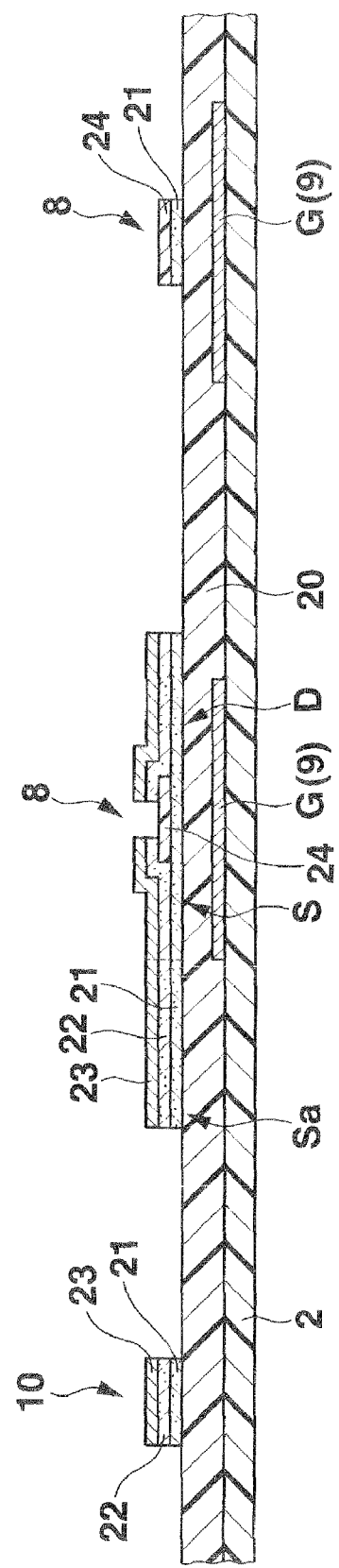
FIG. 10 is an explanatory view of the forming method of the multilayer film formed on the first substrate, showing a state that a second conductive layer is patterned.

Then, a photoresist is applied to an upper side of the metal layer 23, and this applied photoresist is patterned based on exposure and development. Subsequently, the patterned photoresist is utilized as a mask to collectively or continuously etch the semiconductor layer 21, the ohmic contact layer 22, and the metal layer 23 at portions exposed from this photoresist, and thereafter the photoresist is delaminated, whereby the source electrode S, the connection pad portion Sa, the drain electrode D, and the signal line 10 are formed as the patterned second conductive layer 41 (FIG. 10). The semiconductor layer 21 in a region covered with the anti-etching layer 24 remains without being etched since it is protected by the anti-etching layer 24. The thin-film transistor 8 having the semiconductor layer 21, the gate electrode G, the source electrode S, and the drain electrode D is formed.

Then, an inorganic insulating material such as a silicon nitride (SiN or $Si_3N_4$) or a silicon oxide ($SiO_2$) is formed as a translucent second insulating layer 25 on the first substrate 2 by, e.g., the plasma CVD method to cover the patterned second conductive layer 41. When forming the second insulating layer 25 by using the silicon nitride, in regard to a process gas, silane ($SiH_4$) can be used as a main raw material gas, ammonia ($NH_3$) can be used as a sub-raw material gas, and nitrogen ($N_2$) can be used as a diluents gas. The second insulating layer 25 is formed as a film having a layer thickness of, e.g., 200 to 800 nm.

Figure 11:
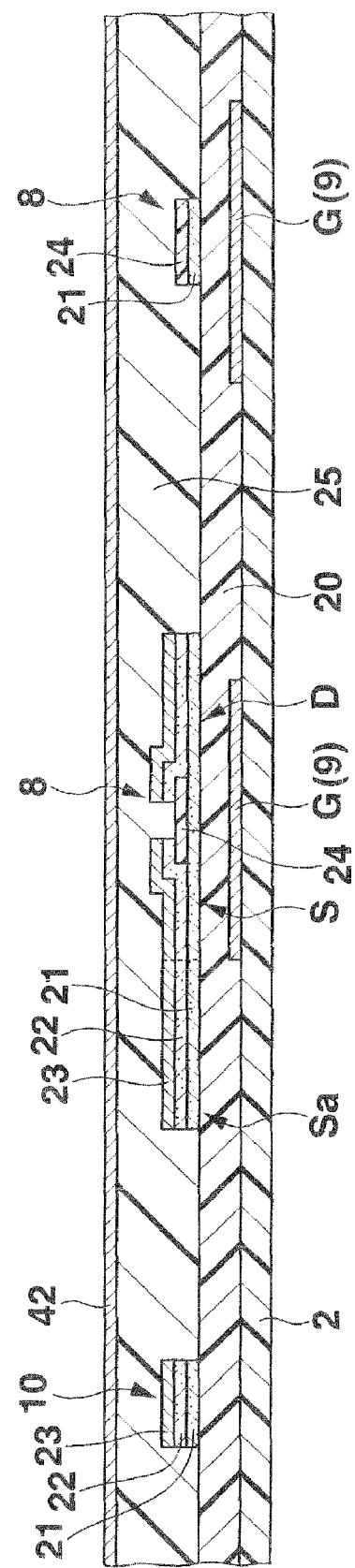
FIG. 11 is an explanatory view of the forming method of the multilayer film formed on the first substrate, showing a state that a third conductive layer is formed as a film on a second insulating layer.

Subsequently, a light shielding metal, e.g., chrome, aluminum, molybdenum, or titanium is formed as a third conductive layer 42 on the second insulating layer 25 by the sputtering method or the CVD method (FIG. 11). The third conductive layer 42 is formed as a film having a layer thickness of, e.g., 100 to 500 nm.

Figure 12:
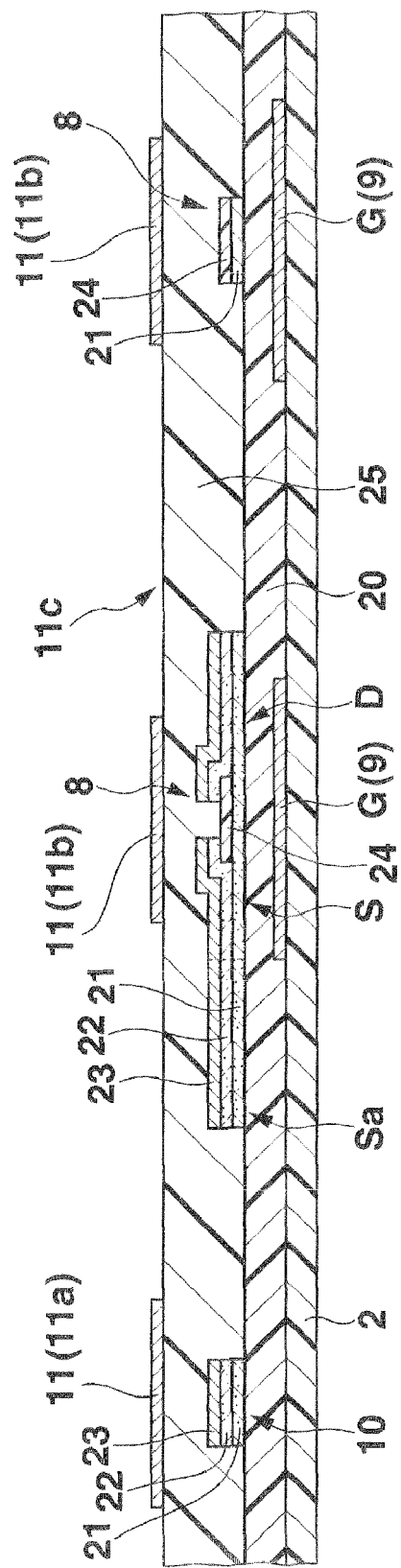
FIG. 12 is an explanatory view of the forming method of the multilayer film formed on the first substrate, showing a state that the third conductive layer is patterned as an auxiliary capacitance electrode.

Then, a photoresist is applied to an upper side of the third conductive layer 42, and this applied photoresist is patterned based on exposure and development. Further, the patterned photoresist is utilized as a mask to etch the third conductive layer 42 as portions exposed from this photoresist, and thereafter the photoresist is delaminated, whereby the auxiliary capacitance electrode 11 is formed as the patterned third conductive layer 42 (FIG. 12).

Then, an inorganic insulating material, e.g., a silicon nitride (SiN or $Si_3N_4$) or a silicon oxide ($SiO_2$) is formed as a translucent third insulating layer 28 on the first substrate 2 by, e.g., the plasma CVD method to cover the auxiliary capacitance electrode 11. When forming the third insulating layer 28 by using the silicon nitride, in regard to a process gas, silane ($SiH_4$) can be used as a main raw material gas, ammonia ($NH_3$) can be used as a sub-raw material gas, and nitrogen ($N_2$) can be used as a diluents gas. The third insulating layer 28 is formed as a film having a layer thickness of, e.g., 100 to 600 nm.

Figure 13:
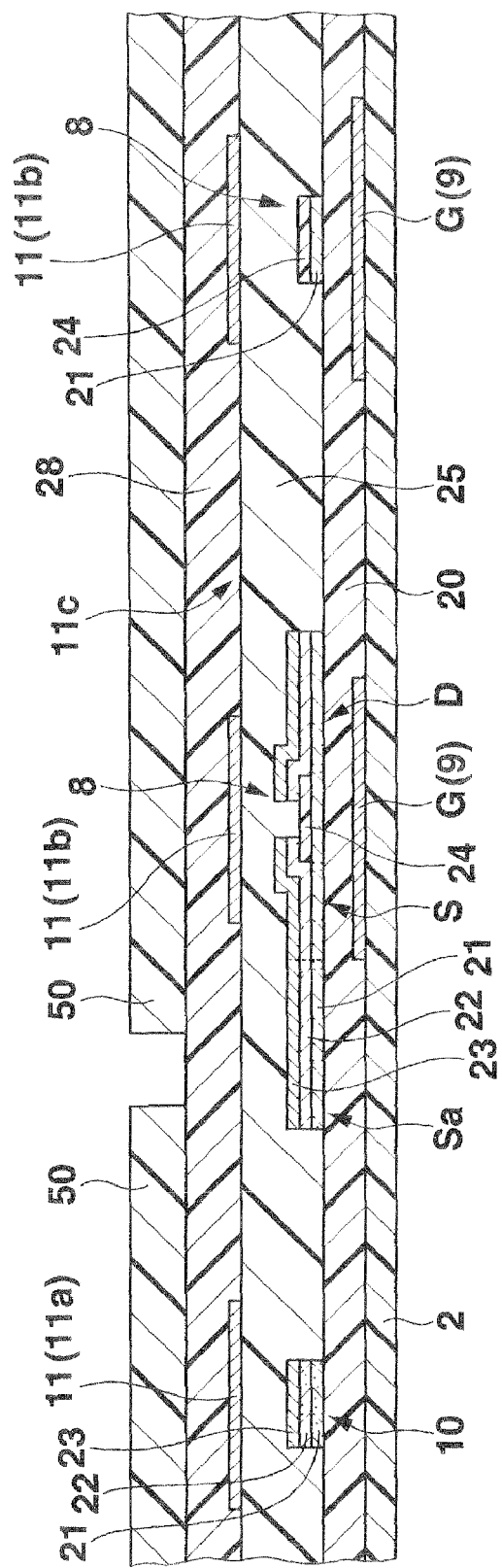
FIG. 13 is an explanatory view of the forming method of the multilayer film formed on the first substrate, showing a state that a contact hole forming photoresist is patterned on the third insulating layer.

Then, a photoresist is applied to an upper side of the third insulating layer 28, and this applied photoresist is patterned based on exposure and development. At this time, as shown in FIG. 13, the patterned photoresist 50 is formed so that the connection pad portion Sa is partially exposed from the photoresist 50.

Figure 14:
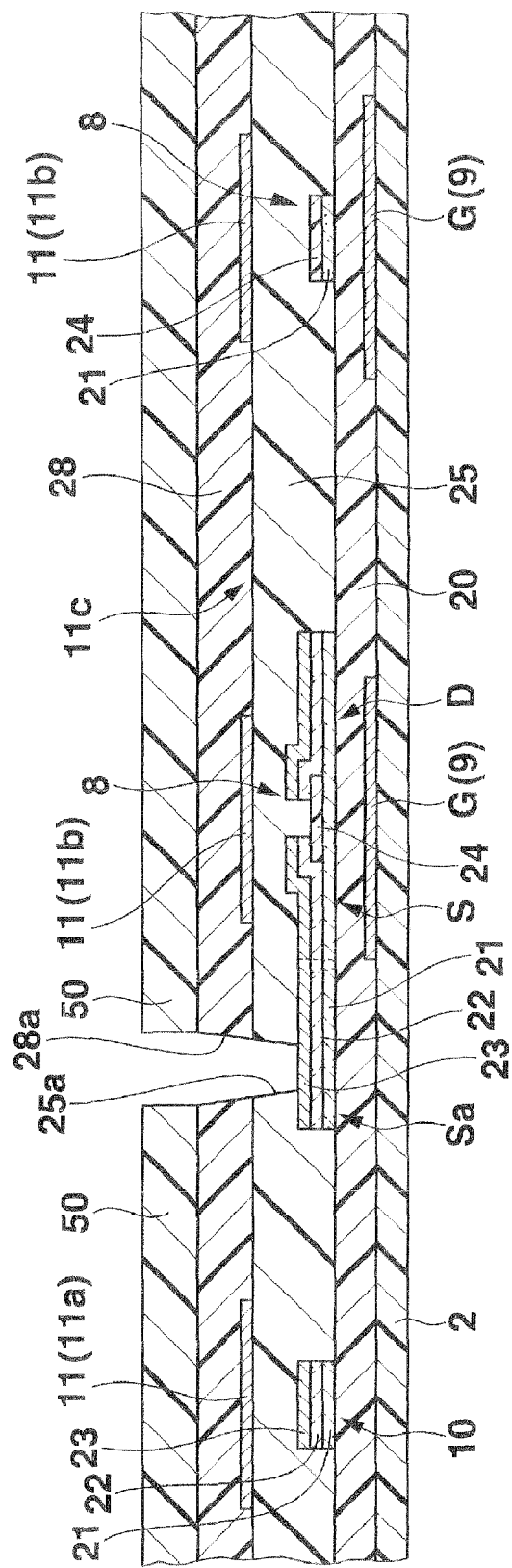
FIG. 14 is an explanatory view of the forming method of the multilayer film formed on the first substrate, showing a state that contact holes are formed in the second insulating layer and the third insulating layer.

Subsequently, the photoresist 50 is utilized as a mask to collectively etch the second insulating layer 25 and the third insulating layer 28 at portions exposed from the photoresist 50 based on, e.g., dry etching, whereby the contact hole 25a is formed in the second insulating layer 25 and the contact hole 28a is formed in the third insulating layer 28 as shown in FIG. 14. As an etching gas, a mixed gas containing, e.g., $CF_4$, $SF_6$, $O_2$, or He can be used.

Figure 15:
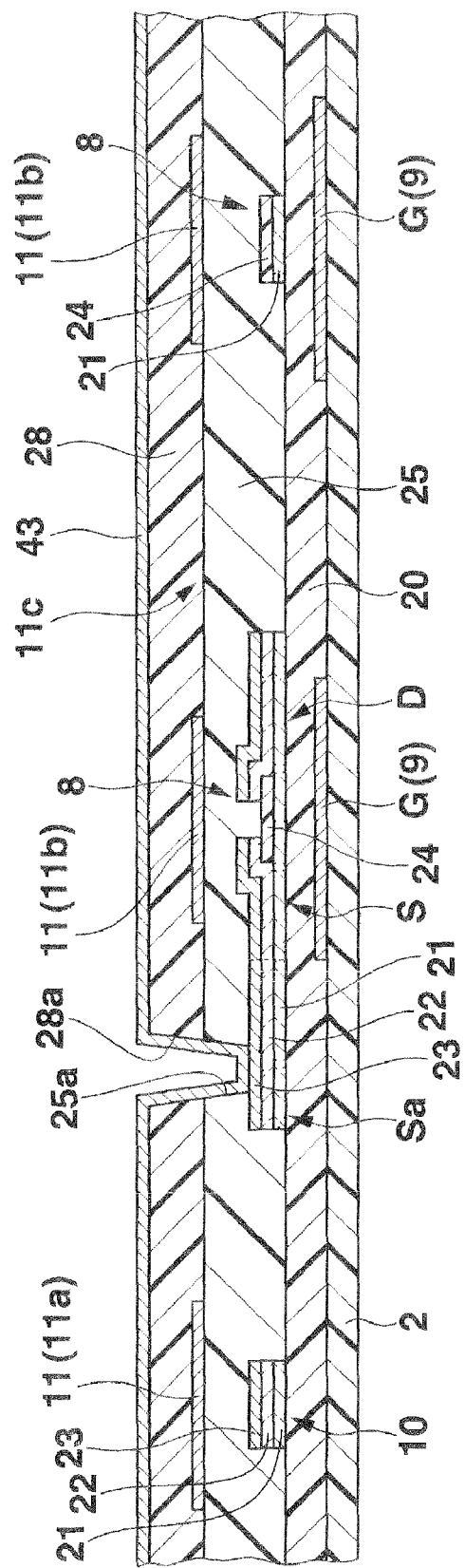
FIG. 15 is an explanatory view of the forming method of the multilayer film formed on the first substrate, showing a state that a fourth conductive layer is formed as a film.

Then, the photoresist 50 is delaminated, and a transparent conductive material, e.g., an ITO is formed as a fourth conductive layer 43 on the first substrate 2 by, e.g., the sputtering method to cover the third insulating layer 27 having the contact holes formed therein (FIG. 15). The fourth conductive layer 43 is formed as a film having a layer thickness of, e.g., 30 to 300 nm.

Subsequently, a photoresist is applied to an upper side of the fourth conductive layer 43, and this applied photoresist is patterned based on exposure and development. Then, the patterned photoresist is utilized as a mask to etch the fourth conductive layer 43 at portions exposed from this photoresist, and thereafter the photoresist is delaminated, whereby the pixel electrode 7 is formed as the patterned fourth conductive layer 43 and such a multilayer film as depicted in FIG. 4 can be obtained.

Although the above has described the case that the first insulating layer 20, the second insulating layer 25, and the third insulating layer 28 are formed by using the inorganic insulating materials in the foregoing embodiment, the first insulating layer 20, the second insulating layer 25, and the third insulating layer 28 may be formed by using polyimide-based or acrylic-based organic materials.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A liquid crystal display element comprising:
a thin-film transistor in which one of a source electrode and a drain electrode is connected to a pixel electrode; and
an auxiliary capacitance electrode which forms an auxiliary capacitance between the auxiliary capacitance electrode itself and the pixel electrode and is arranged to at least partially overlap with the thin-film transistor,
wherein the thin-film transistor comprises: a semiconductor layer; an anti-etching layer which is arranged in contact with the semiconductor layer and made of an insulative material; and a gate electrode which is arranged to interpose the semiconductor layer between the gate electrode itself and the anti-etching layer, and
a region in the auxiliary capacitance electrode which overlaps with the gate electrode has a length in a direction parallel to a channel length direction of the thin-film transistor which is shorter than a length of the gate electrode in this direction and longer than a length of the anti-etching layer in this direction.

2. The liquid crystal display element according to claim 1, wherein the auxiliary capacitance electrode is arranged on a side close to a liquid crystal layer as compared with the thin-film transistor.

3. The liquid crystal display element according to claim 1, wherein the thin-film transistor is an inversely-staggered thin-film transistor.

4. The liquid crystal display element according to claim 1, wherein the gate electrode, the anti-etching layer, and the auxiliary capacitance electrode are arranged so that their inter-edge distances are symmetric in the direction parallel to the channel length direction in a region associated with the thin-film transistor.

5. The liquid crystal display element according to claim 1, wherein the auxiliary capacitance electrode is arranged as a layer between a conductive layer formed as the source electrode or the drain electrode and a conductive layer formed as the pixel electrode.

6. The liquid crystal display element according to claim 1, wherein the gate electrode and the auxiliary capacitance electrode are formed of a light shielding metal and the anti-etching layer is made of a translucent material.

7. A liquid crystal display element comprising:
a liquid crystal layer which is arranged between a common electrode and a pixel electrode;
a thin-film transistor in which one of a source electrode and a drain electrode is connected to the pixel electrode; and
an auxiliary capacitance electrode which is set to a potential equal to the potential of the common electrode and arranged to at least partially overlap with the thin-film transistor,
wherein the thin-film transistor comprises: a semiconductor layer; an anti-etching layer which is arranged in contact with the semiconductor layer and made of an insulative material; and a gate electrode which is arranged to interpose the semiconductor layer between the gate electrode itself and the anti-etching layer, and
a region in the auxiliary capacitance electrode overlapping the gate electrode has a length in a direction parallel to a channel length direction of the thin-film transistor being shorter than a length of the gate electrode in this direction and longer than a length of the anti-etching layer in this direction.

8. The liquid crystal display element according to claim 7, wherein the auxiliary capacitance electrode is arranged as a layer between a conductive layer formed as the source electrode or the drain electrode and a conductive layer formed as the pixel electrode.

9. The liquid crystal display element according to claim 8, wherein the pixel electrode is arranged as a layer on a side close to the auxiliary capacitance electrode as compared with the common electrode.

10. The liquid crystal display element according to claim 7, wherein the thin-film transistor is an inversely-staggered thin-film transistor.

11. The liquid crystal display element according to claim 8, wherein the gate electrode, the anti-etching layer, and the auxiliary capacitance electrode are arranged so that their inter-edge distances are symmetric in the direction parallel to the channel length direction in a region associated with the thin-film transistor.

12. The liquid crystal display element according to claim 8, wherein the gate electrode and the auxiliary capacitance electrode are formed of a light shielding metal and the anti-etching layer is made of a translucent material.

13. A liquid crystal display element comprising:
a scan line which is arranged to extend in a first direction;
a thin-film transistor in which one of a source electrode and a drain electrode is connected to a pixel electrode; and
an auxiliary capacitance electrode which forms an auxiliary capacitance between the auxiliary capacitance electrode itself and the pixel electrode and is arranged to at least partially overlap with the thin-film transistor,
wherein the thin-film transistor comprises: a semiconductor layer; an anti-etching layer which is arranged in contact with the semiconductor layer and made of an insulative material; and a gate electrode which is arranged to interpose the semiconductor layer between the gate electrode itself and the anti-etching layer and connected to the scan line, and
a region in the auxiliary capacitance electrode overlapping the gate electrode has a length in a second direction orthogonal to the first direction being shorter than a length of the gate electrode in the second direction and longer than a length of the anti-etching layer in the second direction.

14. The liquid crystal display element according to claim 13, wherein the auxiliary capacitance electrode is arranged on a side close to a liquid crystal layer as compared with the thin-film transistor.

15. The liquid crystal display element according to claim 13, wherein the thin-film transistor is an inversely-staggered thin-film transistor.

16. The liquid crystal display element according to claim 13, wherein the gate electrode, the anti-etching layer, and the auxiliary capacitance layer are arranged so that their inter-edge distances are symmetric with respect to a direction parallel to the second direction in a region associated with the thin-film transistor.

17. The liquid crystal display element according to claim 13, wherein the auxiliary capacitance electrode is arranged as a layer between a conductive layer formed as the source electrode or the drain electrode and a conductive layer formed as the pixel electrode.

18. The liquid crystal display element according to claim 13, wherein the gate electrode and the auxiliary capacitance electrode are formed of a light shielding metal, and the anti-etching layer is made of a translucent material.

19. The liquid crystal display element according to claim 13, wherein the thin-film transistor is arranged so that a channel width direction is parallel to the first direction.

20. The liquid crystal display element according to claim 19, wherein the gate electrode is provided as a part of the scan line.

* * * * *